United States Patent [19]

McCormack et al.

[11] Patent Number: 5,323,341
[45] Date of Patent: Jun. 21, 1994

[54] METHOD OF INTERCHANGEABLY USING DIP MEMORY DEVICES IN A SINGLE SOCKET

[75] Inventors: Michael D. McCormack, Robbinsdale; Romuald M. Jurewicz, St. Louis Park; Dannis R. Johnson, Savage, all of Minn.

[73] Assignee: Westinghouse Electric Corp., Pittsburgh, Pa.

[21] Appl. No.: 67,639

[22] Filed: May 26, 1993

[51] Int. Cl.$^5$ ............................................. G06F 9/36
[52] U.S. Cl. ......................................... 365/63; 365/51; 365/189.03
[58] Field of Search ....................... 365/51, 63, 189.03

Primary Examiner—Eugene R. LaRoche
Assistant Examiner—F. Niranjan
Attorney, Agent, or Firm—M. J. Moran

[57] ABSTRACT

A method of interchangeably using memory devices constructed from different memory technologies, and/or having different storage capacities, in a predetermined socket of an electrical circuit. The method includes the steps of determining which technology types of memory devices, and storage capacities thereof, are to be interchangeably inserted in the predetermined socket, determining which pin positions of the determined memory devices have like functions, and determining which pin positions have different functions. The method further includes the steps of connecting the socket in the electric circuit such that a predetermined placement position of each determined memory device in the socket will serve the pin positions determined to have like functions. The method includes the steps of providing a jumper block having a predetermined number of connectable input/output terminal pairs, and connecting the jumper block in the electric circuit such that the determined unlike functions are connected to predetermined different input terminals of the jumper block, and predetermined output terminals of the jumper block are connected to predetermined pin positions of the socket. A memory device is selected from the determined memory devices and it is inserted in a predetermined position in the socket. The method then includes the step of determining which input/output terminal pairs of the jumper block should be interconnected for the inserted memory device, and the step of interconnecting the determined pairs of input/output terminals.

7 Claims, 5 Drawing Sheets

FIG. 1

| MEMORY DEVICE | TYPE | PIN NUMBER—32 PIN DEVICE | | | | | | |
| --- | --- | --- | --- | --- | --- | --- | --- | --- |
| | | 1 | 2 | 3 | 29 | 30 | 31 | 32 |
| | | | | PIN NUMBER—28 PIN DEVICE | | | | |
| | | | | 1 | 27 | 28 | | |
| 27C256 | UV EPROM 28 PIN 32 K | | | VPP (+5) | A14 | VCC (+5) | | |
| 27C512 | UV EPROM 28 PIN 64 K | | | A15 | A14 | VCC | | |
| 28C256 | EEPROM 28 PIN 32 K | | | A14 | WE | VCC | | |
| 28C512 | EEPROM 32 PIN 64 K | NC | NC | A15 | A14 | NC | WE | VCC |
| 28F256 | FLASH 32 PIN 32 K | VPP (+12) | NC | NC | A14 | NC | WE | VCC |
| 28F512 | FLASH 32 PIN 64 K | VPP (+12) | NC | A15 | A14 | NC | WE | VCC |

| MEMORY DEVICE | JUMPER PROGRAM C=CONNECT O=OPEN 110 INPUT/OUTPUT TERMINAL PAIR NUMBER | | | | |
|---|---|---|---|---|---|
| | 11/01 | 12/02 | 13/03 | 14/04 | 15/05 |
| 27C256 | C | O | O | O | C |
| 27C512 | O | O | C | O | C |
| 28C256 | O | C | O | C | O |
| 28C512 | O | O | C | O | C |
| 28F256 | O | O | C | O | C |
| 28F512 | O | O | C | O | C |

METHOD OF INTERCHANGEABLY USING DIP MEMORY DEVICES IN A SINGLE SOCKET

TECHNICAL FIELD

The invention relates to a method of interchangeably using DIP memory devices constructed from different memory technologies, and/or having different storage capacities, in a single predetermined socket of an electric circuit.

BACKGROUND ART

A variety of non-volatile memory technologies may be utilized to store program code in any microcontroller system. The three major technologies are: (1) the erasable MOS-technology programmable read-only memory (EPROM), which uses ultraviolet (UV) light to erase the memory, (2) the electrically erasable programmable read-only memory (EEPROM), and (3) the Flash EPROM memory. The Flash EPROM memory combines the electrical erase capability of the EEPROM with the simplicity and lower cost of the EPROM layout. The Flash EPROM memory may be erased while the device is installed in a host system, unlike the UV EPROM, which usually must be removed from the host system for erasure and subsequent reprogramming.

Each of the three major technologies mentioned above implement their footprints with similar but distinctly different pin configurations. Also, within any given technology, certain pin positions change their function as the storage capacity of the device is changed. Thus, when a microcontroller system is designed, it is designed to support a specific memory device for program code storage, selected from one of the available technologies. The storage capacity is selected to support the need for the system being designed. These choices, made when the system is designed, preclude the later use of alternate memory technologies, and/or different storage capacities in a given technology, without resorting to costly redesign of the system. This is not a serious disadvantage when the system being designed is to be manufactured in large quantities. There are many applications for microcontrollers, however, such as transport refrigeration applications, where the production quantities are not large, and/or the microcontroller system is designed to operate in a family of related, but different, applications requiring different degrees of sophistication. In such applications, it would be desirable to make the microcontroller system, as originally designed, extremely flexible in order to match the appropriate memory technology with the individual requirements of each application of the system, as well as to be able to respond to the changing requirements of a given application, without costly redesign or retrofit of the system. Such flexibility would also enable a manufacturer to change the memory technology used in a given microcontroller system as price and availability of different memory technologies fluctuate in the marketplace.

SUMMARY OF THE INVENTION

Briefly, the invention is a method of interchangeably using memory devices constructed from different memory technologies, and/or having different storage capacities, in a predetermined socket of an electrical circuit. The method includes the steps of determining which technology types of memory devices, and storage capacities thereof, are to be interchangeably inserted in the predetermined socket, determining which pin positions of the determined memory devices have like functions, and which pin positions have different functions, and connecting the socket in the electric circuit such that a predetermined placement position of each determined memory device in the socket will serve the pin positions determined to have like functions. The method further includes the steps of providing a jumper block having a predetermined number of connectable input/output terminal pairs, and connecting the jumper block in the electric circuit such that the pin positions having the determined unlike functions are connected to predetermined different input terminals of the jumper block, and predetermined output terminals of the jumper block are connected to predetermined pin positions of the socket. Finally, the method includes the steps of inserting a memory device selected from the determined memory devices in a predetermined position in the socket, determining which input/output terminal pairs of the jumper block should be interconnected for the inserted memory device, and interconnecting the determined pairs of input/output terminals.

BRIEF DESCRIPTION OF THE DRAWINGS

The invention will become more apparent by reading the following detailed description in conjunction with the drawings, which are shown by way of example only, wherein:

FIG. 1 is a table which sets forth a step of the invention in which the footprint differences of different technology memory devices, and different storage capacity devices within a given technology, are determined;

FIG. 3 is a table which illustrates another step of the invention in which a jumper program is developed for the jumper block shown in FIG. 2, to accommodate the footprint differences of the devices selected to be interchangeably used in a given microcontroller system;

DESCRIPTION OF PREFERRED EMBODIMENTS

Figure 2:
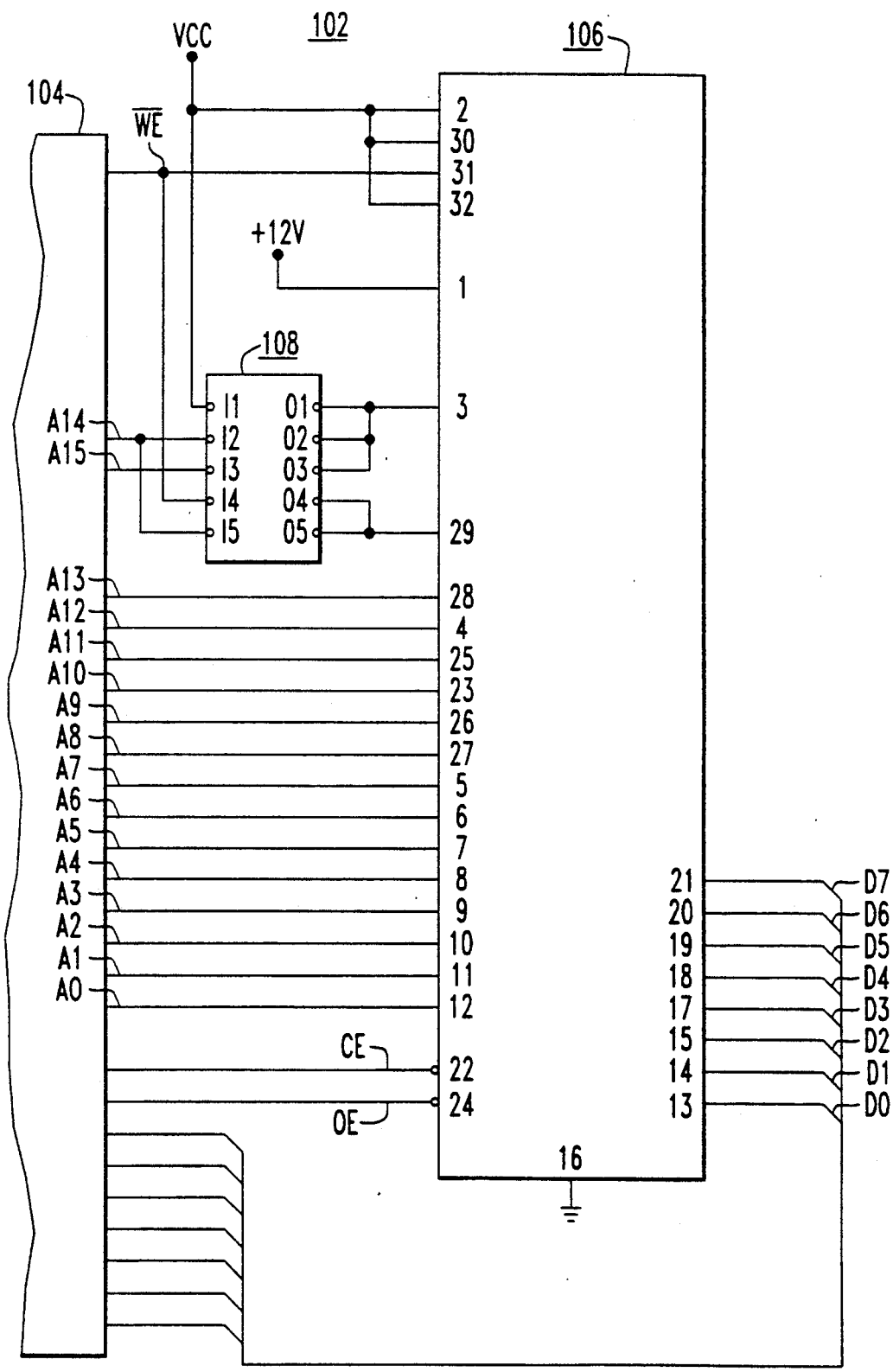
FIG. 2 is a schematic diagram of a microcontroller system designed using the methods of the invention, in which a 32 pin DIP socket is programmed by a five-position jumper block to interchangeably accept 28 pin and 32 pin UV EPROM, EEPROM and Flash EPROM devices having storage capacities of 32K and 64K.

The invention is a method of interchangeably using memory devices constructed from different memory technologies, and/or memory devices having different storage capacities, in a predetermined socket of an electrical circuit, such as an electrical circuit which is part of a microcontroller system. An initial step of the invention includes the step of determining which technology types of non-volatile memory devices, and storage capacities thereof, are to be interchangeably inserted in the predetermined socket. For purposes of example, memory devices from the three main memory technologies UV EPROM, EEPROM, and Flash EPROM have been selected, with devices from each technology being selected to provide 32K × 8 and 64K × 8 storage capacities.

More specifically, UV EPROMs 27C256 and 27C512, having respective storage capacities of 32K and 64K, have been selected, which are available from Intel and others. Both devices have 28 pin DIP (dual-in-line package) configurations. EEPROMs 28C256 and 28C512, having respective storage capacities of 32K and 64K, have been selected, which are available from Xicor and others. Device 28C256 has a 28 pin DIP configuration, and device 28C512 has a 32 pin DIP configuration. Flash EPROMs 28F256 and 28F512, having respective storage capacities of 32K and 64K, have been selected, which are available from Intel and others. Both devices have 32 pin DIP configurations.

Another step of the method is to determine which pin positions of the determined memory devices have like circuit functions, and which pin positions have different circuit functions. FIG. 1 illustrates a table 100 which was developed pursuant to this step of the invention, with table 100 illustrating the pin numbers of the six selected memory devices which have different functions. As indicated in table 100 of FIG. 1, pin numbers 1, 27 and 28 of UV EPROM 27C256 have different functions than one or more of the other memory devices. Pin number 1 requires an operating voltage VPP of +5 volts while in the standby or in the read modes, which pin position may thus be served by a power supply voltage VCC, which is also +5 volts. Pin position number 27 receives address bit A14, and pin position 28 requires the +5 volt power supply voltage VCC.

Continuing with the next device in table 100, UV EPROM 27C512, pin numbers 1, 27 and 28 of device 27C512 have different functions. Pin number 1 receives address bit A15, pin number 27 receives address bit A14, and pin number 28 receives power supply voltage VCC.

The next device in table 100, EEPROM 28C256, also has different functions for pin numbers 1, 27 and 28. Pin number 1 receives address bit A14, pin 27 receives a write enable signal WE, and pin number 28 requires power supply voltage VCC.

EEPROM 28C512 has pin numbers 1, 2, 3, 29, 30, 31 and 32 associated with functions different than one or more of the other devices. Pin numbers 1 and 2 are not connected, indicated by letters "NC", pin numbers 3 and 29 respectively receive address bits A15 and A14, pin number 30 is NC, pin number 31 receives the write enable signal WE, and pin number 32 receives power supply voltage VCC.

Flash EPROMs 28F256 and 28F512 have pin numbers 1, 2, 3, 29, 30, 31 and 32 which are different than one or more of the other selected memories. Pin numbers 1 of the two Flash memory devices are connected to a programming voltage VPP of +12 volts, which enables the Flash memories to be erased and then reprogrammed. Pin numbers 2 of the two devices are NC. Pin number 3 of device 28F256 is NC, while pin number 3 of device 28F512 is connected to address bit A15. Pin numbers 29 of the two devices are connected to address bit A14, pin numbers 30 of the two devices are NC, pin numbers 31 of the two devices are connected to the write enable signal WE, and pin numbers 32 of the two devices are connected to power supply voltage VCC.

It was found that a 32 pin position DIP socket may be used for both the 28 pin and 32 pin memory devices selected, by inserting a 28 pin memory device with pins 1 and 28 in pin positions 3 and 30, respectively, of the DIP socket, and by inserting a 32 pin memory device in the normal position in the DIP socket. With such placement positions of 28 pin and 32 pin devices, it was further found that pin positions 4 through 28 of the DIP socket have like functions for all six memory devices selected. Thus, another step of the method includes the step of connecting the 32 pin position DIP socket in the electric circuit such that the described predetermined placements of the 28 pin and 32 pin memory devices will serve the pin positions having the determined like functions, i.e., pin positions 4 through 28 of the DIP socket.

FIG. 2 is a schematic diagram of an electrical circuit 102 which is associated with a microcontroller shown generally at 104. Electric circuit 102 includes a 32 pin position socket 106 which has the hereinbefore mentioned like function pin positions 4 through 28 permanently wired in the electrical circuit 102. Pin position 1 may be connected to +12 volts, as illustrated, since pin number 1 of the 32 pin device 28C512 is NC. Pin positions 2, 30 and 32 may also be directly connected to power supply voltage VCC. Thus, it is only pin positions 3 and 29 that receive different signals, depending upon the memory device utilized. The different signals for pin number 3 are the +5 volt operating voltage VPP, and address bits A14 and A15. The different signals for pin number 29 are address bit A14 and the write enable signal WE.

Another step of the method is to provide a jumper block having a predetermined number of connectable input/output terminal pairs, with the number being determined by the number of determined differences in the footprints of the selected memory devices. For the devices selected for purposes of example, a five position jumper block is required. The method then includes the steps of connecting the jumper block in the electric circuit such that the determined unlike functions power supply voltage VCC and address bits A14 and A15, for pin number 3, and address bit A14 and the write enable signal WE, for pin number 29, are connected to predetermined different input terminals of the jumper block, and predetermined output terminals of the jumper block are connected to the predetermined pin positions, i.e., pin positions 3 and 29, of the socket.

FIG. 2 illustrates a jumper block 108 having first, second, third, fourth and fifth input/output terminal pairs, I1/O1, I2/O2, I3/O3, I4/O4, and I5/O5, respectively. The terminal pairs start at the upper end of block 108 and proceed downwardly, as indicated in FIG. 2, with the input and output terminals of the first pair being indicated at I1 and O1, respectively, etc.

Another step of the method includes determining which input/output terminal pairs of jumper block 108 should be interconnected for each of the memory devices. FIG. 3 is a table 110 which includes a jumper program developed pursuant to this step of the invention, for each of the selected memory devices. The letter "C" indicates that the associated input/output terminal pair should be interconnected via an appropriate jumper, and the letter "O" indicates that the associated pair should be "open", i.e., not interconnected.

For UV EPROM 27C256, the first input/output terminal pair I1/O1 and the fifth input/output terminal pair I5/O5 should be interconnected via appropriate jumpers, while the remaining input/output terminal pairs are not interconnected. In like manner, for UV EPROM 27C512, only the third pair I3/O3 and the fifth pair I5/O5 are interconnected; for EEPROM 28C256 only the second pair I2/O2 and the fourth pair I4/O4 are interconnected; for EEPROM 28C512 only the third pair I3/O3 and the fifth pair I5/O5 are interconnected; and, for the Flash EPROMs 28F256 and 28F512, only the third pair I3/O3 and the fifth pair I5/O5 are interconnected. Technically only the fifth pair I5/O5 need be interconnected for Flash EPROM 28F256, as pin number 3 is NC. However, since two jumpers are required for the other devices, it prevents losing a jumper by programming jumper block 108 identically for both Flash EPROMs, thus using two jumpers for all of the memory devices.

Figure 4:
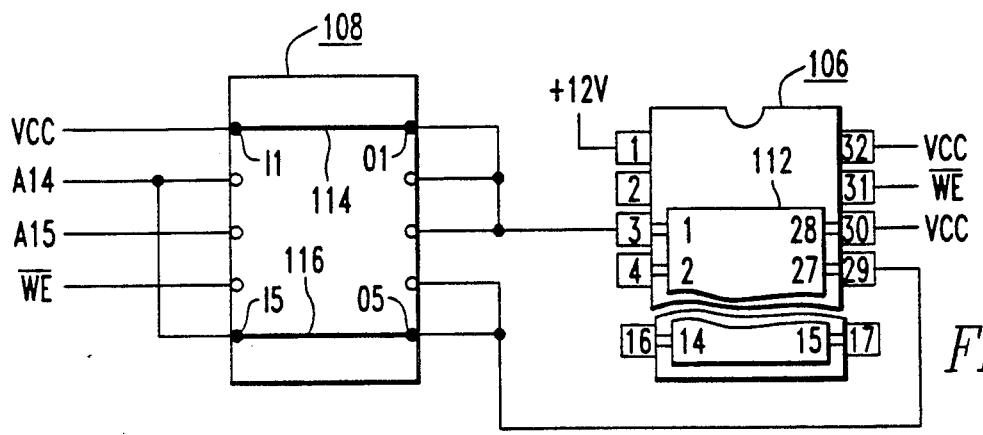
FIG. 4 illustrates the 32 pin DIP socket and jumper block shown in FIG. 2, with the 32 pin DIP socket having UV EPROM 27C256, a 28 pin, 32K device, inserted therein, and with the jumper block being programmed for this memory device.

FIG. 4 illustrates the 32 pin position DIP socket 106 and jumper block 108, with an UV EPROM 27C256, indicated at 112, inserted in socket 106. It will be noted, that since memory device 112 is a 28 pin device, that memory device 112 is inserted according to a method step of the invention, with pin numbers 1 and 28 of memory device 112 respectively engaging pin positions 3 and 30 of the 32 pin position DIP socket 106. Jumper block 108 is programmed according to the teachings of the invention, as indicated in table 110 of FIG. 3, by connecting jumpers 114 and 116 to respectively interconnect the first pair I1/O1 and the fifth pair I5/O5 of input output terminals.

Figure 5:
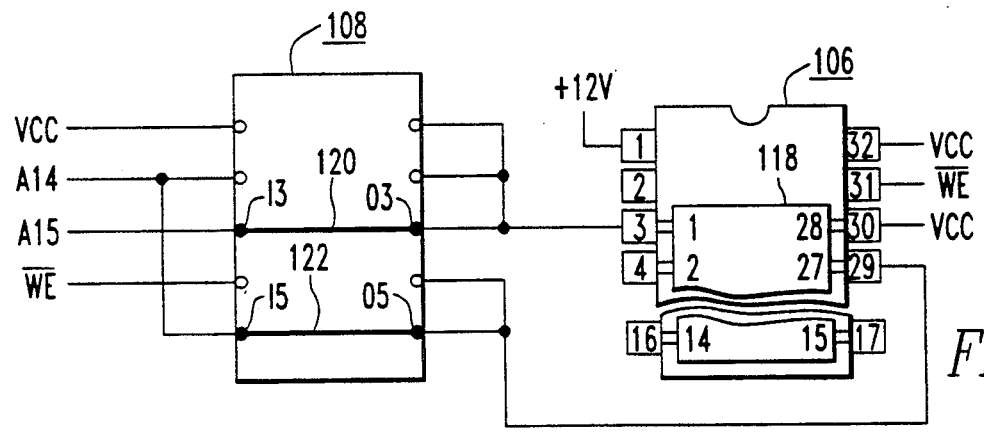
FIG. 5 illustrates the 32 pin DIP socket and jumper block shown in FIG. 2, with the 32 pin DIP socket having UV EPROM 27C512, a 28 pin, 64K device, inserted therein, and with the jumper block being programmed for this memory device.

FIG. 5 is similar to FIG. 4, except illustrating an UV EPROM 27C512, indicated at 118, inserted in socket 106. Memory device 118 is also a 28 pin device and is thus placed in socket 106 such that pin numbers 1 and 28 of memory device 118 respectively engage pin positions 3 and 30 of the 32 pin position DIP socket 106. Jumper block 108 is programmed according to the teachings of the invention, as indicated in table 110 of FIG. 3, by connecting jumpers 120 and 122 to respectively interconnect the third pair I3/O3 and the fifth pair I5/O5 of input output terminals.

Figure 6:
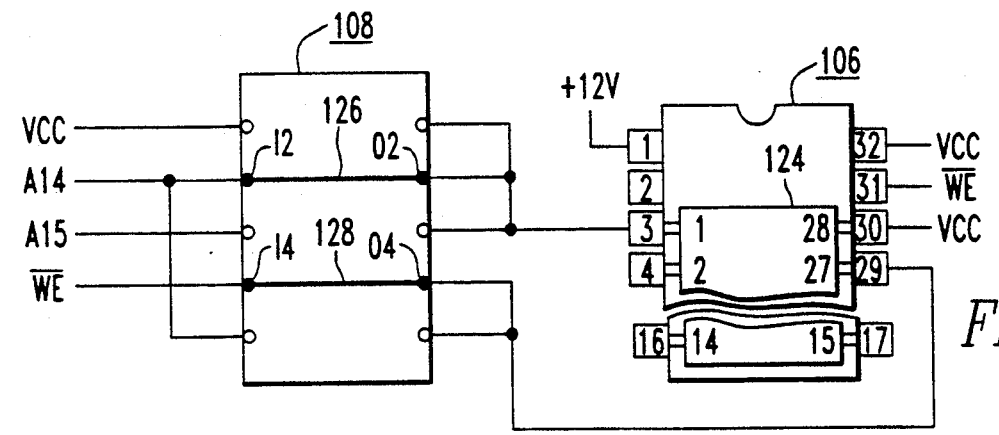
FIG. 6 illustrates the 32 pin DIP socket and jumper block shown in FIG. 2, with the 32 pin DIP socket having EEPROM 28C256, a 28 pin, 32K device, inserted therein, and with the jumper block being programmed for this memory device.

FIG. 6 is similar to FIGS. 4 and 5, except illustrating an EEPROM 28C256, indicated at 124, inserted in socket 106. Memory device 124 is also a 28 pin device and is thus placed in socket 106 such that pin numbers 1 and 28 of memory device 124 respectively engage pin positions 3 and 30 of the 32 pin position DIP socket 106. Jumper block 108 is programmed according to the teachings of the invention, as indicated in table 110 of FIG. 3, by connecting jumpers 126 and 128 to respectively interconnect the second pair I2/O2 and the fourth pair I4/O4 of input output terminals.

Figure 7:
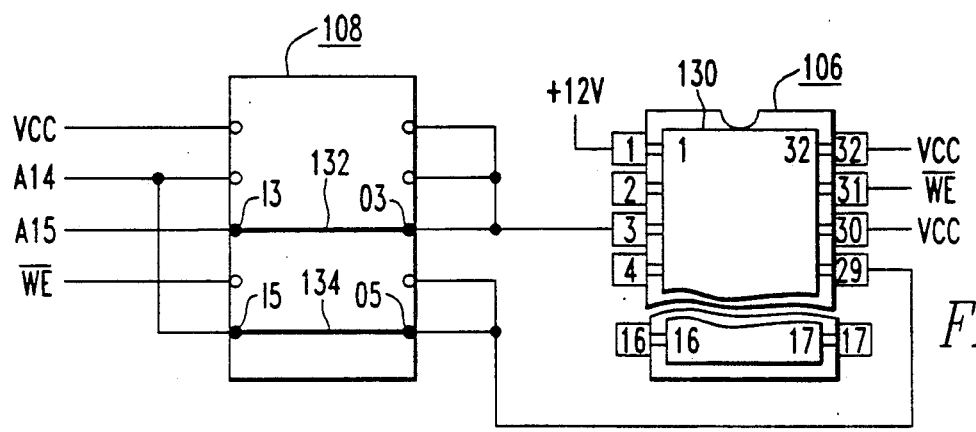
FIG. 7 illustrates the 32 pin DIP socket and jumper block shown in FIG. 2, with the 32 pin DIP socket having EEPROM 28C512, a 32 pin, 64K device, inserted therein, and with the jumper block being programmed for this memory device.

FIG. 7 is similar to FIGS. 4, 5, and 6 except illustrating an EEPROM 28C512, indicated at 130, inserted in socket 106. Memory device 130 is a 32 pin device and is thus placed in socket 106 in the conventional position, with pin numbers 1 and 32 of memory device 130 respectively engaging pin positions 1 and 32 of the 32 pin position DIP socket 106. Jumper block 108 is programmed according to the teachings of the invention, as indicated in table 110 of FIG. 3, by connecting jumpers 132 and 134 to respectively interconnect the third pair I3/O3 and the fifth pair I5/O5 of input output terminals.

Figure 8:
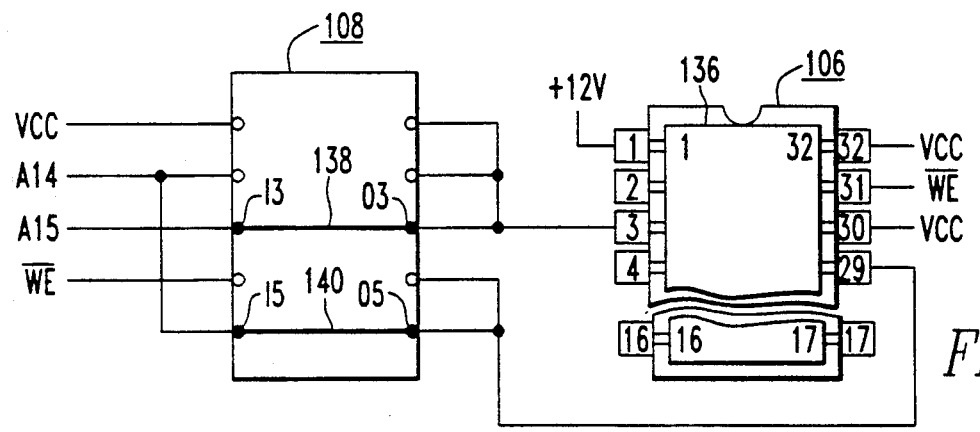
FIG. 8 illustrates the 32 pin DIP socket and jumper block shown in FIG. 2, with the 32 pin DIP socket having either Flash EPROM 28F256, a 32 pin, 32K device, inserted therein, or Flash EPROM 28F512, 32 pin, 64K device, inserted therein, and with the jumper block being programmed to accommodate either of these two Flash memory devices.

FIG. 8 is similar to FIGS. 4, 5, 6 and 7, except illustrating a Flash EPROM 28F256, or a Flash EPROM 28C512, indicated at 136, inserted in socket 106. Both Flash memory devices 136 are 32 pin devices and they are placed in socket 106 in the conventional position, i.e., with pin numbers 1 and 32 of memory device 136 respectively engaging pin positions 1 and 32 of the 32 pin position DIP socket 106. Jumper block 108 is programmed according to the teachings of the invention, as indicated in table 110 of FIG. 3, by connecting jumpers 138 and 140 to respectively interconnect the third pair I3/O3 and the fifth pair I5/O5 of input output terminals.

We claim:

1. A method of interchangeably using memory devices constructed from different memory technologies and/or having different storage capacities, in a predetermined socket of an electrical circuit, comprising the steps of:

determining which technology types of memory devices, and storage capacities thereof, are to be interchangeably inserted in the predetermined socket, determining which pin positions of the determined memory devices have like functions, and which pin positions have unlike functions, connecting the predetermined socket in the electric circuit such that a predetermined placement position of each determined memory device in the socket will serve the pin positions determined to have like functions, providing a jumper block having a predetermined number of connectable input/output terminal pairs, connecting the jumper block in the electric circuit such that the pin positions having the determined unlike functions are connected to predetermined different input terminals of the jumper block, and predetermined output terminals of the jumper block are connected to predetermined pin positions of the socket, inserting a memory device selected from the determined memory devices in a predetermined position in the socket, determining which input/output terminal pairs should be interconnected for the inserted memory device, and interconnecting the determined pairs of input/output terminals.

2. The method of claim 1 wherein the predetermined socket is a 32 pin position DIP socket having first and second longitudinal ends, with pin positions 1 and 32 being at the first longitudinal end, and pin positions 16 and 17 being at the second longitudinal end, and wherein the predetermined placement position of a selected memory device in the socket includes the step of placing a memory device having a 28 pin DIP package with pin numbers 1 and 28 respectively engaging pin positions 3 and 30 of the 32 pin DIP socket.

3. The method of claim 1 wherein the predetermined socket is a 32 pin position DIP socket having first and second longitudinal ends, with pin positions 1 and 32 being at the first longitudinal end, and pin positions 16 and 17 being at the second longitudinal end, and wherein the predetermined placement position of a selected memory device in the socket includes the step of placing a memory device having a 32 pin DIP package with pin numbers 1 and 32 respectively engaging pin positions 1 and 32 of the 32 pin DIP socket.

4. The method of claim 1 wherein the predetermined socket is a 32 pin position DIP socket having first and second longitudinal ends, with pin positions 1 and 32 being at the first longitudinal end, and pin positions 16 and 17 being at the second longitudinal end, and wherein the step of determining which memory devices are to be interchangeably inserted in the DIP socket includes the step of selecting memory devices having 28 pin DIP configurations and memory devices having 32 pin DIP configurations, with positions 4 through 28 of the DIP socket being associated with like functions for each selected device when pins 1 and 28 of a memory device having a 28 pin DIP configuration are respectively inserted in pin positions 3 and 30 of the DIP socket, and when pins 1 and 32 of a memory device having a 32 pin DIP configuration are respectively inserted in pin positions 1 and 32 of the DIP socket.

5. The method of claim 1 wherein the step of determining which technology types of memory devices, and storage capacities thereof, are to be interchangeably inserted in the predetermined socket, includes the step of selecting 32K and 64K DIP memory devices from the UV EPROM, EEPROM and Flash EPROM technologies.

6. The method of claim 5 wherein the electric circuit includes a power supply voltage VCC, a write enable signal WE, and address bits A0–A15, the step of providing a jumper block selects a jumper block having first, second, third, fourth and fifth jumper interconnectable input/output terminal pairs, and wherein the step of connecting the jumper block in the electric circuit includes the steps of:
   connecting the power supply voltage VCC to the input terminal of the first terminal pair,
   connecting address bit A14 to the input terminal of the second and fifth terminal pairs,
   connecting address bit A15 to the input terminal of the third terminal pair,
   connecting the write enable signal WE to the input terminal of the fourth terminal pair,
   connecting the output terminals of the first, second and third terminal pairs to pin position 3 of the DIP socket,
   and connecting the output terminals of the fourth and fifth terminal pairs to pin position 29 of the DIP socket.

7. The method of claim 6 including the step of connecting a voltage for programming Flash EPROMs to pin position 1 of the DIP socket, and the power supply voltage VCC to pin positions 30 and 32 of the DIP socket.

* * * * *